United States Patent [19]

Sado

[11] Patent Number: 4,475,164
[45] Date of Patent: Oct. 2, 1984

[54] ELECTRONIC APPARATUS HAVING TELEVISION DEVICE

[75] Inventor: Ichiro Sado, Tokyo, Japan

[73] Assignee: Canon Kabushiki Kaisha, Tokyo, Japan

[21] Appl. No.: 485,380

[22] Filed: Apr. 18, 1983

Related U.S. Application Data

[63] Continuation of Ser. No. 179,941, Aug. 21, 1980, abandoned.

[30] Foreign Application Priority Data

Aug. 28, 1979 [JP] Japan .............................. 54-109457
Aug. 29, 1979 [JP] Japan .............................. 54-110121
Aug. 29, 1979 [JP] Japan .............................. 54-110122

[51] Int. Cl.³ ...................... H04B 1/16; G06F 3/153
[52] U.S. Cl. .................................. 364/705; 364/708; 364/709; 340/711; 340/365 R; 455/179
[58] Field of Search ............... 364/705, 708, 521, 710, 364/709, 569; 455/179, 181; 340/711, 365 R, 309.15

[56] References Cited

U.S. PATENT DOCUMENTS

| | | | |
|---|---|---|---|
| 3,973,205 | 8/1976 | Tanaka | 340/711 |
| 4,088,958 | 5/1978 | Suzuki et al. | 455/181 |
| 4,121,162 | 10/1978 | Alberkrack et al. | 325/421 |
| 4,162,513 | 7/1979 | Beyers | 455/181 |
| 4,194,159 | 3/1980 | Sasaki | 455/179 |
| 4,220,922 | 9/1980 | Ikeguchi | 455/186 |
| 4,220,992 | 9/1980 | Blood | 364/709 |
| 4,228,543 | 10/1980 | Jackson | 340/309.1 |
| 4,236,152 | 11/1980 | Masuzawa | 364/705 |
| 4,259,668 | 3/1981 | Nishimura | 364/706 |
| 4,318,130 | 3/1982 | Heuer | 455/179 |
| 4,364,026 | 12/1982 | Steckler | 455/179 |

FOREIGN PATENT DOCUMENTS 116051 10/1978 Japan .............................. 364/710

Primary Examiner—Jerry Smith
Assistant Examiner—Michael R. Fleming
Attorney, Agent, or Firm—Fitzpatrick, Cella, Harper & Scinto

[57] ABSTRACT

This electronic apparatus has combined functions of an electronic calculator or the like and a television receiver, and is automatically shifted, at the start of the calculator function, to a vacant television channel for the display of calculator functions on the television screen and returned to the television receiving function at the end of the calculator function.

18 Claims, 8 Drawing Figures

ELECTRONIC APPARATUS HAVING TELEVISION DEVICE

This application is a continuation of application Ser. No. 179,941 filed Aug. 21, 1980, now abandoned.

BACKGROUND OF THE INVENTION

1. Field of the Invention

The present invention relates to an electronic apparatus having a television device.

2. Description of the Prior Art

There has been already proposed a television receiver combined with an electronic calculator which functions as an ordinary television receiver and which utilizes the television screen for the display of calculator functions, but in such apparatus there has been required a switching operation for selecting either the calculator function or the television receiving function.

SUMMARY OF THE INVENTION

The object of the present invention is to provide an electronic apparatus which is provided with a calculator keyboard accommodated in or detachably mounted on a television receiver and which is automatically shifted, when said keyboard is extracted or detached, to a vacant television channel for the display of calculator functions on the television screen and automatically returned to the previous television channel for the television receiving function when said keyboard is returned to the original position.

Another object of the present invention is to provide an electronic apparatus having a television receiver capable functioning as a calculator, a teaching machine, a video game or the like in a vacant television channel of the television receiver, and of automatically shifting to such a vacant channel for example upon actuation of a calculation instruction key, without requiring an instruction to shift to such vacant channel by the user.

Still another object of the present invention is to provide a television device which is automatically shifted to a predetermined vacant television channel at a predetermined time and returns to the original television channel after the lapse of a predetermined period.

Still another object of the present invention is to provide an electronic apparatus comprising:

selecting means for selecting one of plural channels;

switching means for switching the channel selected by said selecting means over to a predetermined one of said plural channels; and a television receiving unit associated with said selecting means and said switching means for permitting display of respective images of said plural channels in cooperation.

Still another object of the present invention is to provide an electronic apparatus comprising:

clock means for providing time information;

memory means for memorizing scheduled times;

comparator means for comparing the time information supplied from said clock means with said scheduled times stored in said memory means;

selecting means for selecting one of plural channels;

switching means for switching the channel selected by said selecting means over to a predetermined one of said plural channels in response to the output from said comparator means; and a television receiving unit associated with said selecting means and said switching means for permitting display of respective images of said plural channels.

Still another object of the present invention is to provide an electronic apparatus comprising:

a keyboard for information entry;

a housing section provided in said apparatus for accommodating said keyboard;

detecting means for detecting that said keyboard is extracted from said housing section;

selecting means for selecting one of plural channels;

switching means for switching the channel selected by said selecting means over to a predetermined one of said plural channels in response to the output of said detecting means; and a television receiving unit associated with said selecting means and said switching means for permitting display of respective images of said plural channels.

Still other objects and advantages of the present invention will be made apparent from the following description of the preferred embodiments to be taken in conjunction with the attached drawings.

DESCRIPTION OF THE PREFERRED EMBODIMENTS

Now the present invention will be described in detail with reference to embodiments thereof shown in the attached drawings.

Figure 1:
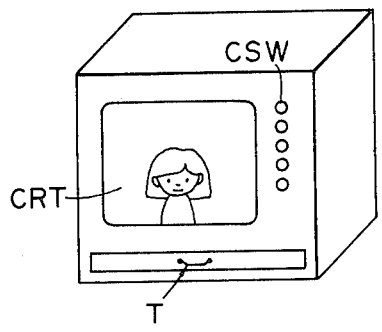
FIG. 1 is a schematic view of an embodiment of the apparatus of the present invention.

FIG. 1 shows an embodiment of the present invention in a perspective external view, wherein there are shown a keyboard extracting handle T, a channel selecting switch group CSW and a display unit CRT including of a cathode ray tube.

Figure 2:
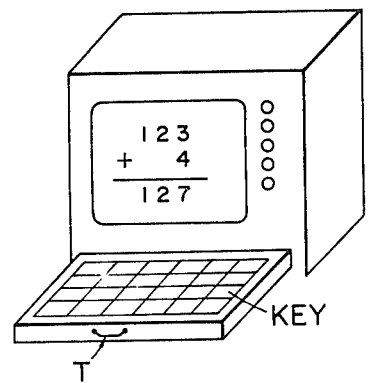
FIG. 2 is a view of the apparatus of FIG. 1 from which the keyboard is extracted.

FIG. 2 shows the same embodiment in the calculator mode in which a keyboard KB is extracted by said keyboard extracting handle T.

Figure 3:
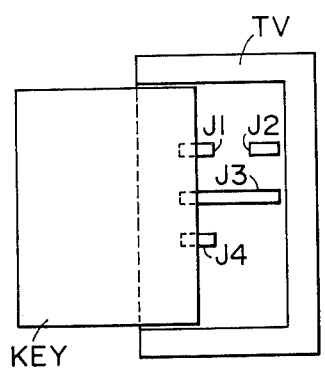
FIG. 3 is a horizontal cross-sectional view of the apparatus shown in FIG. 2.
Figure 4:
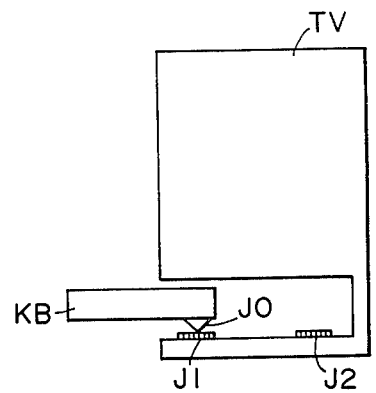
FIG. 4 is a vertical cross-sectional view of the apparatus shown in FIG. 2.

FIG. 3 is a horizontal cross-sectional view of the embodiment shown in FIG. 1, wherein the television receiver set is provided with signal terminals J1, J2, J3 and J4 for detecting the extraction of the keyboard KB. Such terminals can for example be composed of suitable patterns on a printed circuit board. More specifically a standard voltage $V_{ss}$ is supplied to the terminal J3, transmitted to a contact J0 provided on the bottom face of the keyboard KB and further transmitted to the terminal J1 or J2 according to the amount of extraction of said keyboard KB, whereby it is rendered possible, at the television receiver, to identify the extent of extraction of the keyboard KB. The terminal J4 is utilized for transmitting other key signals generated by the key actuations after the keyboard is thus extracted. FIG. 4 shows the displacement of the contact J0 of the keyboard KB over said terminals J1, J2.

In this manner the key unit KEY can be made very thin, and the number of keys can be arbitrarily selected by accordingly increasing the number of signal terminals J4. The sliding portions of the keyboard and the television receiver should naturally be provided with suitable engaging grooves or the like.

Figure 5:
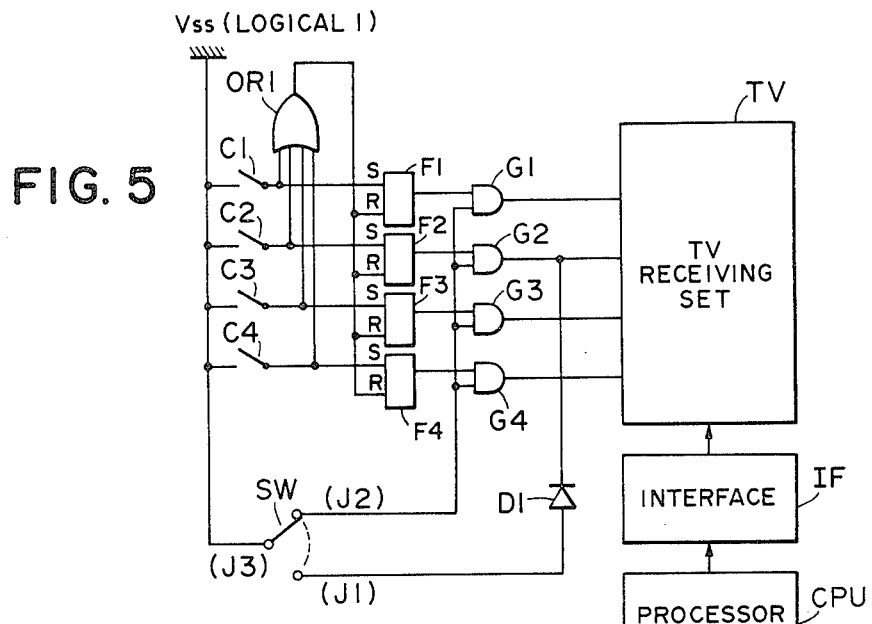
FIG. 5 is a schematic circuit diagram of the embodiment shown in FIG. 1.

FIG. 5 shows an embodiment of the signal processing circuit in the detector shown in FIGS. 3 and 4, wherein channel selecting buttons C1, C2, C3 or C4, when actuated or touched, transmit the aforementioned voltage $V_{ss}$ to respectively set the flip-flop F1, F2, F3 or F4 and to send said voltage to the reset port R of said flip-flops through an OR gate OR1 thereby resetting the previously selected channel.

Said flip-flops F1-F4 are of the set-preferential type, so that, upon actuation of the button C1 for example, the flip-flop C1 is set by set-preferential function though it simultaneously receives the set signal and the reset signal, while the flip-flops F2, F3 and F4 are reset through the OR gate OR1 because of the absence of the set signal.

SW represents the detector shown in FIG. 3, wherein the voltage level $V_{ss}$ is supplied to the terminal J2 or J1 respectively when the keyboard is housed in the television receiver or extracted therefrom.

Although not shown in the drawing, the buttons C1, C2, C3 and C4 and the detector SW are maintained, at the open state thereof, at a negative voltage level for example by connection to a negative voltage level $-V_{DD}$ through a resistor. In FIG. 5 there are also shown a key input unit KEY for the calculator, a calculation processing unit CPU, an interface unit IF for storing the signals from said processing unit CPU and for supplying the information to be displayed in a signal matching the vacant television channel through an RF modulating circuit for display on the cathode ray tube, and a television receiving set TV capable of selecting the receiving channel according to the channel selecting signal from the input unit, thus receiving the signal from said interface IF or the broadcast television signal and displaying the same on the cathode ray tube CRT.

When the keyboard is housed in the television receiving set, the AND gates G1-G4 are ready to be opened through the terminal J2, whereby the channel selection is controlled through said AND gates by the state of the flip-flops F1-F4. On the other hand, when the keyboard is extracted, the voltage level $V_{ss}$ supplied through the terminal J1 is added, through a diode D1, to the output of the AND gate G2.

In this manner the television receiving set identifies the extraction of the keyboard KB as if the channel 2, corresponding to the button C2 and assumed to be a vacant channel in the present embodiment, is selected, and the rehousing of the keyboard causes the previous channel to be instructed through said AND gates to the television receiving set.

As explained in the foregoing, the user can therefore use the television set as a calculator in an extremely simple manner.

Naturally said vacant channel can be freely selected according to the local situation.

Also it is possible, within the scope of the present invention, to employ plural keyboards for purposes other than as a calculator.

Besides the present invention facilitates the understanding of the operations for the user and enables the multi-purpose utilization of the television receiving set without unfavorably affecting the aesthetic aspect of the apparatus.

In the following there will be explained another embodiment of the present invention with a channel switching system.

Figure 6:
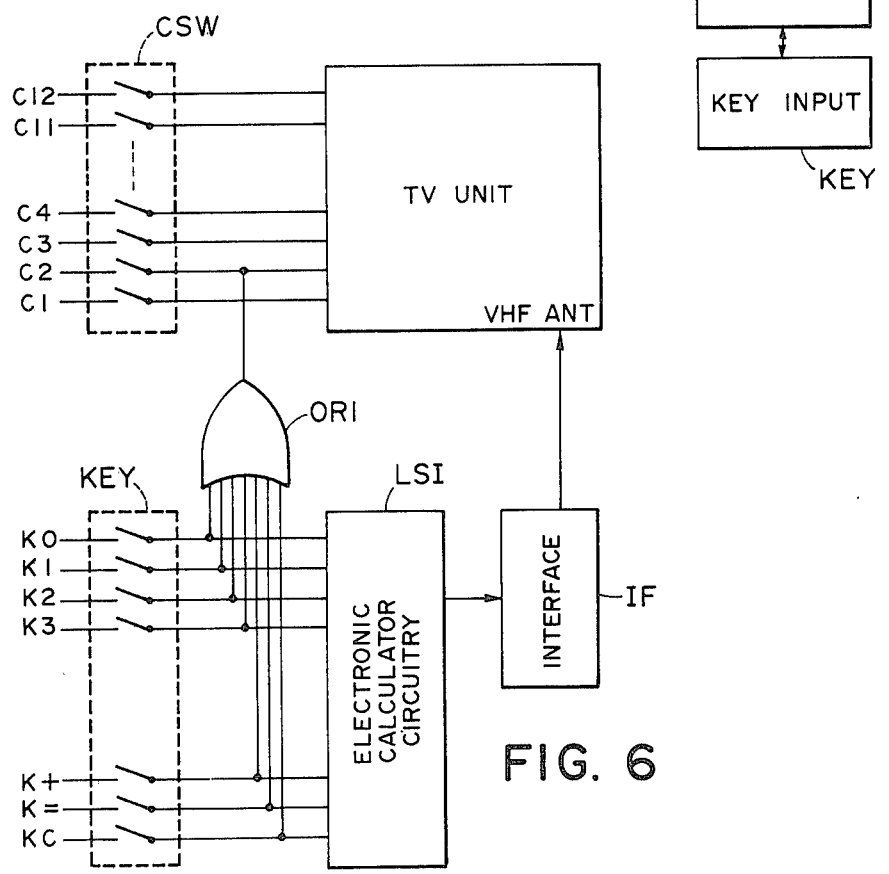
FIG. 6 is a block diagram of main parts of the circuit of the electronic apparatus having a television device embodying the present invention.

FIG. 6 illustrates, in a block diagram, a television receiving set with a calculator embodying the present invention, wherein there are shown channel selecting keys CSW for example composed of touch sensors; signal lines C1-C12 for transmitting the key signals to said key group CSW; calculating keys KEY composed of numeral keys "0"-"9" and function keys such as "+", "=", "CLEAR" etc.; signal lines K0, K1..., KC therefor; an OR gate OR1 receiving all or a part of the key signals from said calculation keys KEY and connected for example to the signal line C2 for selecting a vacant channel; an ordinary large-scale integrated circuit LSI for calculator; an interface circuit IF for storing the information to be displayed from said integrated circuit LSI in a random access memory RAM and converting said information into television display signals for example by an RF modulating circuit of which output is supplied to the aerial of the television receiving set; aerial terminals VHF ANT for example for a 75-ohm VHF television aerial; and a television receiving unit TV UNIT from which the channel selecting switches are eliminated.

In the above explained embodiment, when the calculation keys KEY are actuated for a calculation during the reception of a television channel in response to a channel selecting key CSW, a selection signal for the vacant channel is transmitted through the OR gate OR1 to the television receiving unit TV UNIT which is thus shifted to the state of receiving said vacant channel. Subsequent actuations of the calculation keys KEY cause the appropriate data processing in the integrated circuit LSI, of which output is displayed through the interface circuit IF on the television receiving unit TV UNIT.

In the foregoing embodiment the television receiving unit displays the output of the calculator, but it is also possible to cause the display of the output of other devices.

Figure 7:
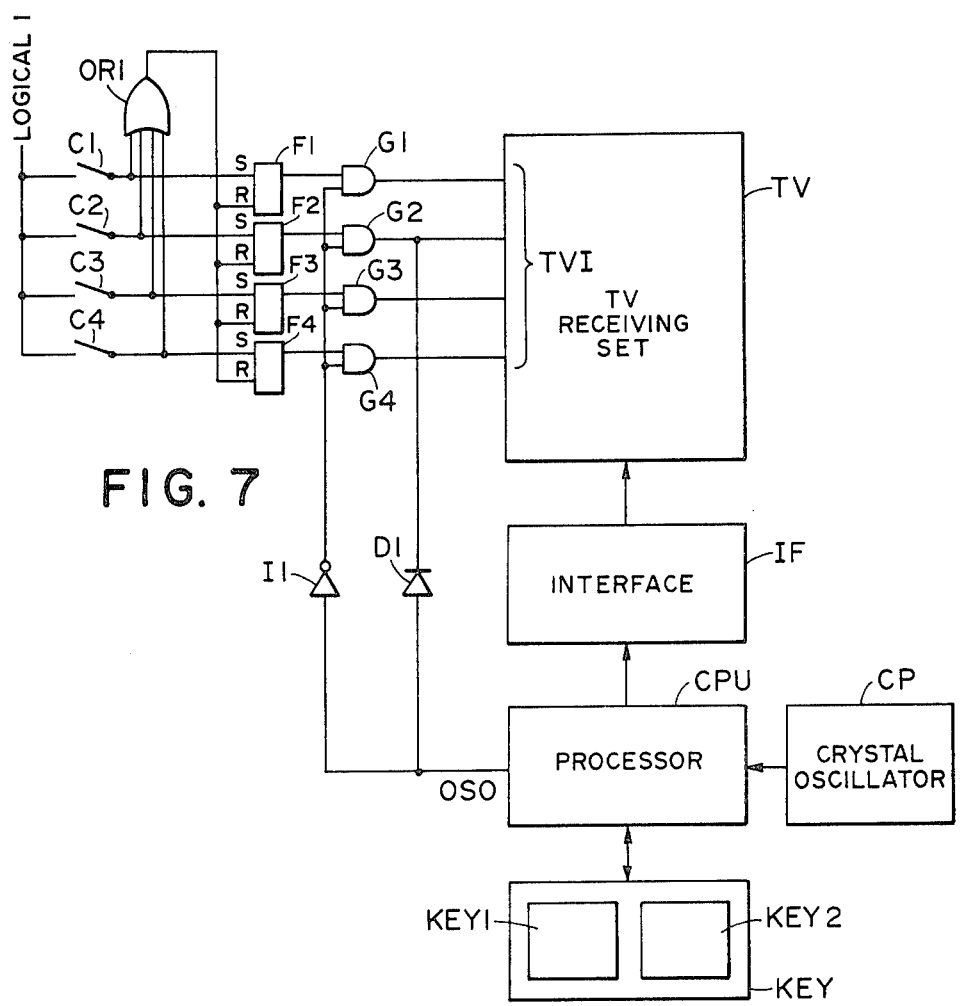
FIG. 7 is a block diagram of the circuit of the television device embodying the present invention.

In the following there will be explained still another embodiment of the present invention. FIG. 7 shows, in a block diagram, an embodiment of the television device of the present invention, wherein C1, C2, C3 and C4 are channel selecting push-button switches. For the purpose of simplicity of the explanation, the number of channels is limited to four, in which the second channel is assumed to be vacant. F1, F2, F3 and F4 are set-preferential flip-flops. Upon actuation for example of the button C1, a logic 1 signal is supplied to the set port S of the flip-flop F1 to shift it to the set state. An OR gate OR1 performs OR an logic function of the signals from said buttons C1-C4 to provide a reset signal to the reset ports R of said flip-flops F1-F4 in response to the actuation of any of said buttons, but the flip-flop F1 alone continues to release the high-level output signal because of the aforementioned set-preferential structure. A logic 0 signal is supplied to the set ports when said buttons C1-C4 are not actuated.

An input unit KEY, composed of numeral keys, character keys etc. at least comprises an input unit KEY1 for entering a scheduled time and an input unit KEY2 for entering a scheduled information, wherein the binary coded signals generated by said keys are stored in a memory in the central processing unit.

CP is a clock pulse generator composed of a crystal oscillator, counters etc. and supplies time information in binary coded signals to said processing unit.

A central processing unit CPU compares the time information with the scheduled time, and, when the two coincide, supplies said scheduled information to the interface circuit IF and releases a signal OSO.

Figure 8:
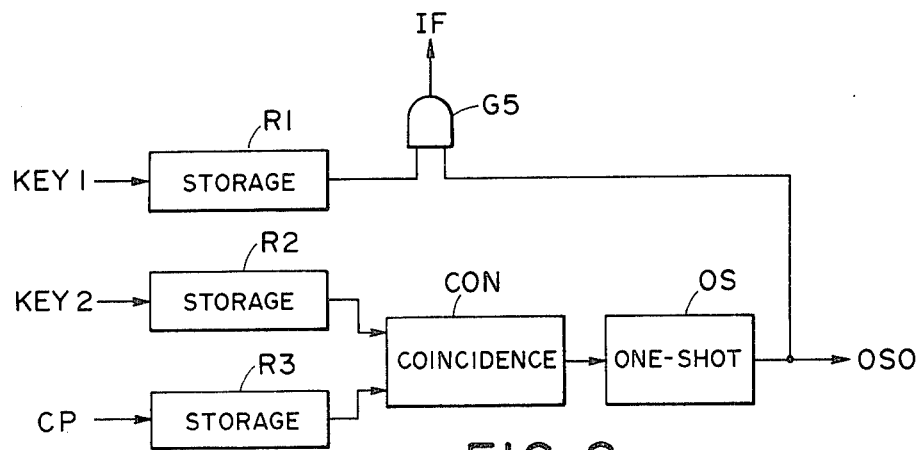
FIG. 8 is a block diagram of the central processing unit shown in FIG. 7.

FIG. 8 shows, in a block diagram, the principal part of the processing unit CPU shown in FIG. 7, wherein there are shown a first storage R1 for storing the information other than the scheduled time from the input unit KEY2 such as the scheduled information in the form of binary coded signals; a second storage R2 for storing the scheduled time information supplied from the input unit KEY2; a third storage R3 for storing in succession the current time information supplied from the clock pulse generator CP; a coincidence circuit CON composed for example of an exclusive-OR flip-flop for continuously comparing the contents of said storages R2 and R3 and releasing a determined pulse signal in case of coincidence of said contents; a one-shot multivibrator circuit OS for releasing a logic 1 signal for a determined period in response to said pulse signal from the coincidence circuit CON; and an AND gate G5 for transmitting the content of said storage R1 to the interface circuit IF when said signal OSO is at the level 1. Said signal OSO from the processing unit CPU is maintained at the logic level 1 for a determined period when the time information entered by the input unit KEY coincides with that supplied from the clock pulse generator CP, and is supplied, after inversion by an inverter I1, to the AND gates G1-G4 to forbid the outputs therefrom, and at the same time a logic 1 signal is supplied through a diode D1 to the output of the gate G2 to cause the selection of a particular channel (channel 2 in the illustrated embodiment) during a determined period.

Other output signals from the processing unit CPU, which are the information to be displayed, are supplied to the interface circuit IF.

The interface circuit IF, comprising for example an RF modulator, converts the signals from the processing unit CPU into the signals adapted for display in said vacant channel and supplies thus converted signals to the television receiving unit for example through the aerial terminals thereof.

The television receiving set TV displays the signals received from the aerial thereof according to the channel selected by the channel selecting signal supplied to an input unit TV1 thereof.

The function of the above-explained embodiment is as follows. In case information "3", "hour", "M", "E", "E", "T", "I", "N" and "G" are entered from the keyboard, the signal "3" is stored in the storage R2 while the data "MEETING" are stored in the storage R1, both in the form of binary signals.

It is now assumed that the user is watching the television of the channel 1 by actuating the button C1. When the time information from the clock pulse generator CP indicates 3 o'clock, the coincidence circuit CON releases the output pulse to cause the one-shot multivibrator OS to release the logic 1 signal for example for 1 minute, whereby the AND gate G1 is closed and the television receiver set is instructed to display channel 2 through the diode D1 connected to the output of the gate G2. At the same time the AND gate G5 (FIG. 8) is opened to cause the codes "MEETING", stored in the storage R1, to be displayed on the television screen for 1 minute through the interface circuit IF.

After the lapse of said one minute the signal OSO is returned to the 0-level, whereby the AND gate G1 is opened again to again instruct the original channel 1.

As explained in the foregoing, the present invention allows to provide an extremely convenient television device.

Also the circuits other than the television receiving set itself and the interface circuit IF can be designed with a very low power consumption and can therefore be continuously driven even when the main switch of the television set is turned off. Thus it is easily possible to turn on the main switch by said signal OSO.

The foregoing explanation has been limited to the visual display on the cathode ray tube, but it will be readily understood that the speaker of the television receiving set can also be utilized for example for giving a determined sound signal.

What is claimed is:

1. A electronic system, comprising:
    a television set capable of receiving a television broadcast, said television set having selecting means for selecting any one of a plurality of channels, at least one of said plurality of channels being selected by said selecting means to receive said television broadcast;
    data processing means for processing data, said data processing means including first means for producing a first signal as an output upon commencement of data processing and second means for producing a result of the data processing;
    means connected to said television set and said data processing means for enabling the result from said second means to be received by a specific one of said plurality of channels of said television set; and
    control means associated with said selecting means and said first means of said data processing means, for changing, in response to said first signal, from the channel to receive said television broadcast selected by said selecting means to said specific channel to receive the result of the data processing through said enabling means.

2. An electronic system according to claim 1, wherein said data processing means includes keyboard input means and said first means produces said first signal by operation of said keyboard input means.

3. An electronic system according to claim 1, wherein said data processing means further includes keyboard input means insertable into and extractable from said telvision set; and said first means includes detecting means for detecting the insertion and extraction of said keyboard input means and for producing said first signal as an output on extraction of said keyboard input means 4. An electronic system according to claim 1, wherein said data processing means includes clock means for providing time information, time memory means for storing scheduled time information, and comparator means for comparing said time information from said clock means with said scheduled time information stored in said memory means; and for applying a signal to said first means upon coincidence of said time information and said scheduled time information thereby permitting production of said first signal as output.

5. An electronic system according to claim 4, wherein said data processing means further includes data information memory means for storing scheduled data corresponding to said scheduled time information and for sending said scheduled data to said television set through said second means of said data processing means.

6. An electronic system according to claim 1, 2, 3, or 5, further comprising means for supplying the output of said second means of said data processing means to an antenna terminal of said television set.

7. An electronic system according to claim 1, wherein said selecting means includes a plurality of switches, each corresponding to each of said plurality of channels.

8. An electronic system according to claim 7, further comprising a memory connected to all of said plurality of button switches, for storing information for actuating said plurality of button switches.

9. An electronic system, comprising:
a television receiver means capable of receiving a television broadcast, said television receiver means having selecting means for selecting any one of a plurality of channels, at least one of said plurality of channels being selected by said selecting means to receive said television broadcast, said television receiver means having means for displaying said television broadcast;
data processing means connected to said television receiver means for processing data, said data processing means including first means for producing a first signal as an output upon commencement of data processing, a second means for producing a result of the data processing, and keyboard input means insertable into and extractable from said television receiver means, said first means including detecting means for detecting the position of said keyboard input means and for producing said first signal as an output upon extraction of said keyboard input means; and
control means associated with said first means of said data processing means for changing the display of said television broadcast to a display of the result of the data processing in response to said first signal.

10. An electronic system according to claim 9, wherein said selecting means includes means for inhibiting the operation of said selecting means.

11. An electronic system according to claim 10, wherein said control means includes means for changing a reception channel to a specific channel to display the result of said data processing means in response to said first signal of said first means.

12. An electronic system, comprising:
a television receiver means capable of receiving a television broadcast, said television receiver means having selecting means for selecting any one of a plurality of channels, at least one of said plurality of channels being selected by said selecting means to receive said television broadcast, and display means for displaying said television broadcast;
data processing means connected to said television receiver means for processing data, said data processing means including first means for producing a first signal as an output upon commencement of data processing, second means for producing a result of said data processing, clock means for providing time information, time memory means for storing schedule time information, data information memory means for storing schedule data corresponding to the schedule time information which is different from information concerning said television broadcast, and comparator means for comparing the time information from said clock means to the schedule time information stored in said memory means and for applying a signal to said first means upon coincidence of the time information and the schedule time information to permit production of said first signal as an output; and
control means connected to said data processing means and associated with said first means of said data processing means, for changing the display of said television broadcast to a display of the result of the data processing in response to said first signal.

13. An electronic system according to claim 12, wherein said control means includes means for changing a channel of said television broadcast to a specific channel to display the result of said data processing means in response to said first signal of said first means.

14. An electronic system according to claim 12, further comprising input means for entering said schedule time information and said schedule data into said time memory means and said data information memory means.

15. An electronic system according to claim 12, further comprising means for inhibiting the operation of said selecting means in response to said first signal of said first means.

16. An electronic system, comprising:
selecting means for selecting any one of a plurality of channels, at least one of said plurality of channels being selected by said selecting means to receive a television broadcast;
display means connected to said selecting means for displaying said television broadcast;
data input means for entering data;
data processing means connected to said display means for processing the entered data, said data processing including first means for producing a first signal as an output upon commencement of the data processing, and having second means for producing the result of the data processing; and
control means associated with said first means of said data processing means, for changing the display of said television broadcast to a display of the result of the data processing in response to said first signal.

17. An electronic system according to claim 16, further comprising means for prohibiting the operation of said selecting means by said first signal of said first means.

18. An electronic system according to claim 16, wherein said control means includes means for changing a channel to a specific channel to display the result of the data processing in a response to said first signal of said first means.

* * * * *